US008947270B2

(12) United States Patent
Gopal et al.

(10) Patent No.: US 8,947,270 B2
(45) Date of Patent: Feb. 3, 2015

(54) APPARATUS AND METHOD TO ACCELERATE COMPRESSION AND DECOMPRESSION OPERATIONS

(71) Applicants: Vinodh Gopal, Westborough, MA (US); James D. Guilford, Northborough, MA (US); Gilbert M. Wolrich, Framingham, MA (US)

(72) Inventors: Vinodh Gopal, Westborough, MA (US); James D. Guilford, Northborough, MA (US); Gilbert M. Wolrich, Framingham, MA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/931,877

(22) Filed: Jun. 29, 2013

(65) Prior Publication Data

US 2015/0006853 A1 Jan. 1, 2015

(51) Int. Cl.
*H03M 7/00* (2006.01)
*G06F 9/30* (2006.01)

(52) U.S. Cl.
CPC .................................. *G06F 9/30145* (2013.01)
USPC .. 341/50; 375/241; 375/E7.144; 375/E7.027; 382/224; 382/305; 382/243; 382/238; 382/233

(58) Field of Classification Search
CPC ........... H03M 7/30; H03M 7/34; H03M 7/40; H03M 7/3086; H03M 7/3088
USPC .................. 341/50, 51, 65, 67, 106; 375/241, 375/E7.027, E7.144; 382/224, 305, 243, 382/238, 233, 239
See application file for complete search history.

(56) References Cited

U.S. PATENT DOCUMENTS 7,307,552 B2 * 12/2007 Ma et al. .......................... 341/51
7,353,233 B1 * 4/2008 Ganca ..................... 375/E7.144
7,872,598 B2 * 1/2011 Baktir et al. .................... 341/67
8,125,357 B1 * 2/2012 Hamlet et al. .................. 341/51
8,325,357 B2 * 12/2012 Hasebe ........................ 358/1.15

OTHER PUBLICATIONS

"Specification of the 3GPP Confidentiality and Integrity Algorithms 128-EEA3 & 128-EIA3, Document 2: ZUC Specification", ETSI/SAGE Specification, Version: 1.6, Date: Jun. 28, 2011, *The ZUC algorithm is the core of the standardized 3GPP Confidentiality and Integrity algorithms 128-EEA3 & 128-EIA3*, 3GPP Confidentiality and Integrity Algorithms 128-EEA3 & 128-EIA3, ZUC Algorithm Specification Verison 1.6, p. 18.

* cited by examiner

*Primary Examiner* — Lam T Mai
(74) *Attorney, Agent, or Firm* — Blakely, Sokoloff, Taylor & Zafman LLP

(57) ABSTRACT

A processor is described that includes an instruction execution pipeline having an instruction fetch unit to fetch and decode an instruction. The processor also has an execution unit to execute the instruction. The execution unit has a state machine and content addressable memory (CAM) circuitry. The state machine is to receive a pointer to a stream of DEFLATE encoded information, fetch a section of the DEFLATE encoded information and apply the section of the DEFLATE encoded information to the CAM to obtain decoded DEFLATE information.

21 Claims, 19 Drawing Sheets

| LITERAL BYTE | HUFFMAN TREE NODE ID | ENCODED VALUE | |
|---|---|---|---|
| 0000 0000 | 0 | 0011 0000 | (8 BITS) |
| 0000 0001 | 1 | 0011 0001 | (8 BITS) |
| 0000 0010 | 2 | 0011 0010 | (8 BITS) |
| ⋮ | ⋮ | | |
| 1111 1111 | 255 | 1111 11111 | (9 BITS) |

EOB

| | 256 | | |
|---|---|---|---|

| LENGTH PART OF L/D PAIR | | | |
|---|---|---|---|
| 3 | 257 | | (≤ 6 BITS) |
| 4 | 258 | | (≤ 6 BITS) |
| 5 | 259 | | |
| ⋮ | ⋮ | | |
| 10 | 264 | | (≤ 6 BITS) |

| 11, 12 | 265 | | 6 BITS + 1 EXTRA BIT |
|---|---|---|---|
| 13, 14 | 266 | | 6 BITS + 1 EXTRA BIT |
| ⋮ | ⋮ | | |
| 195-226 | 283 | | 6 BITS + 5 EXTRA BITS |
| 227-257 | 284 | | 6 BITS + 5 EXTRA BITS |
| 258 | 285 | | (≤ 6 BITS) |

| | ENCODED INPUT | DECODED LITERAL OUTPUT | ENCODED INPUT SIZE | TYPE | DECODED LENGTH | EXTRA BITS |
|---|---|---|---|---|---|---|
| 0 | 0011 0000 | 0000 0000 | 1000 | 01 | – | – |
| 1 | 0011 0001 | 0000 0001 | 1000 | 01 | – | – |
| ⋮ | | | | | | |
| 255 | 1111 11111 | 1111 1111 | 1001 | 01 | – | – |
| 256 | [EOB] | | – | 00 | | |
| | ENCODED INPUT | DECODED LENGTH OUTPUT | | | | |
| 257 | | – | | 10 | | |
| 258 | | – | | 10 | | |
| 259 | | – | | 10 | | |
| ⋮ | | | | | | |
| 264 | | – | | 10 | | – |
| 265 | | – | | 11 | | 0001 |
| 266 | | – | | 11 | | 0001 |
| ⋮ | | | | | | |
| 283 | | – | | 11 | | 0101 |
| 284 | | – | | 11 | | 0101 |
| 285 | | – | | 10 | | – |

FIG. 5A 502 531 530 533

| | ENCODED INPUT | | TYPE | EXTRA BITS |
|---|---|---|---|---|
| 0 | | 01 | 0 | – |
| 1 | | 10 | 0 | – |
| 2 | | 11 | 0 | – |
| ⋮ | | | | |
| 9 | | | 1 | 0011 |
| ⋮ | | | | |
| 17 | | | 1 | 0111 |
| ⋮ | | | | |
| 29 | | | 1 | 1101 |

FIG. 5B

PIPELINE 1100

CORE 1190

APPARATUS AND METHOD TO ACCELERATE COMPRESSION AND DECOMPRESSION OPERATIONS

BACKGROUND

LZ77 Compression Algorithm

Compression algorithms strive to reduce an amount of data without sacrificing the information within the data. One type of compression algorithm, referred to as the LZ77 algorithm, achieves compression by replacing repeated occurrences of data with references to a single copy of that data existing earlier in the input (uncompressed) data stream. A match is encoded by a pair of numbers called a length-distance pair (the "distance" is sometimes called the "offset" instead).

To spot matches, the encoder keeps track of some amount of the most recent data, such as the last 2 kB, 4 kB, or 32 kB. The structure in which this data is held is called a "sliding window" (as such, LZ77 is sometimes called sliding window compression). The encoder keeps the most recent data within the sliding window to look for matches (and the decoder likewise will keep this data to interpret the matches the encoder refers to).

FIG. 1 shows a simple example of an LZ77 encoding scheme. As observed in FIG. 1, the bit patterns of a preceding (earlier or older) portion 101 of a bit stream 100 is compared against a current portion 102 of the bit stream. If a sequence of bits is found in the current portion 102 that matches a sequence of bits in the preceding portion 101, the sequence of bits in the current portion 102 is replaced with a reference to the same sequence of bits in the earlier portion 101. For example, the bit sequence in the current portion 102 would be replaced with a reference to bit sequence 103 in the earlier portion 101.

The reference that is inserted for bit sequence 102 identifies the length 104 of bit sequence 102 (which also is the same as the length of bit sequence 103) and the location of bit sequence 103. Here, the location of bit sequence 103 is expressed as a "distance" 105 from the current portion 102 to the matching bit sequence 103. As such, the LZ77 compression scheme encodes a bit sequence 102 as a "length, distance pair" that is inserted in the bit stream in place of sequence 102. Upon decoding the compressed stream, when the decoder reaches the length, distance pair that is embedded in the bit stream in place of bit sequence 102, it simply uses the distance part of the length, distance pair to refer back to the start of bit sequence 103 and reproduces the correct bit sequence for portion 102 of the decoded stream by reproducing a number of bits from the start of bit sequence 103 that is equal to the length component of the length, distance pair.

DEFLATE Compression Algorithm

The DEFLATE compression scheme, which is used to compress gzip, Zlib, PKZip and WinZip files, uses the LZ77 compression algorithm along with other compression schemes to effect a comprehensive overall compression scheme.

FIG. 2 shows an overview of the DEFLATE compression algorithm. As observed in FIG. 2, after LZ77 compression, the compressed bit stream 200 can be viewed as a series of length/distance pairs 201_1, 201_2, . . . 201_M intermixed with literals 202_1, 202_2, . . . 202_N. Literals correspond to bit patterns within the original bit stream for which no earlier identical pattern could be identified within the applicable window for conversion into a length/distance pair.

The DEFLATE compression algorithm then proceeds to incorporate a next level of compression 203 upon the LZ77 compressed stream 200. The next level of compression 203 introduces two different types of Huffman encoding that together replace more common bit patterns of the length/distance pairs 201 and literals 202 with smaller codes 204 and less common bit patterns of the length/distance pairs 201 and literals 202 with larger codes 205. A first type of Huffman encoding is used to encode literals and lengths. A second type of Huffman encoding is used to encode distances. By representing more common bit patterns of the LZ77 compressed stream 200 with fewer bits, the overall size of the information as presented in the final DEFLATE compressed stream 206 should be reduced.

A representation of the first type of Huffman encoding, used for literals and lengths, is presented in FIG. 3. As observed in FIG. 3, literal information is broken down on a byte-by-byte basis. As a byte corresponds to 8 bits of information, there are 2^8=256 different literal byte values (from 0 to 255 in decimal terms). Each literal byte value corresponds to a node in a Huffman tree, where, the identity of the nodes themselves correspond 1:1 with the values of the literals (i.e., a literal byte of 00000000 corresponds to a Huffman tree node identity of 0, a literal byte of 00000001 corresponds to a Huffman tree node identity of 1, . . . , a literal byte of 11111111 corresponds to a Huffman tree node identity of 255).

Each Huffman tree node has an associated encoding value that is directly inserted into the bit stream as an encoded symbol for that tree node's corresponding literal byte. Thus, for instance, Huffman tree node 0 has a Huffman encoding of 00110000 and Huffman tree node 255 has a Huffman encoding of 111111111. As such, a literal byte of 00000000 in stream 203 will be encoded in the DEFLATE compressed bit stream 206 as 00110000, and, a literal byte of 11111111 in stream 203 will be encoded in the DEFLATE compressed bit stream 206 as 111111111. Notably, a literal byte of 00000000 has a higher probability of occurrence than a literal byte of 11111111, and, as such, the encoding of a literal byte of 00000000 in stream 200 consumes less bit space (00110000 has 8 bits) in the finally encoded bit stream 206 than the encoding of a literal byte 11111111 in stream 200 (111111111 has 9 bits).

The Huffman tree also has a node with an identity of 256. That node corresponds to the appearance in stream 200 of an end of block (EOB) symbol. In the deflate compression scheme, the overall data is broken down into smaller blocks and the demarcation between neighboring blocks is marked with an EOB symbol. For simplicity an EOB symbol is not shown in stream 200 nor is its encoded value shown in stream 206.

The Huffman tree includes an additional 29 nodes having identities 257 through 285 that are used to encode the length information (window size) of a length, distance pair. The length information can be 3 to 258 bytes. Here, tree identities 257 through 264 and 285 correspond to specific (and more frequently encountered) lengths (specifically, identity 257 corresponds to a length of 3 bytes, identity 258 corresponds to a length of 4 bytes, . . . etc., . . . identity 264 corresponds to a length of 10 bytes and identity 285 corresponds to a length of 258 bytes). Each of identities 257 through 264 and 258 are encoded with 6 bits or less (with more frequent lengths consuming less than 6 bits and less frequent lengths consuming up to 6 bits.

Identities 265 through 284 of the Huffman tree are used to specify length ranges rather than specific lengths. Here, lengths within a range 11 bytes to 257 bytes are specified across identities 265 through 284. Each Huffman tree node identity corresponds to a different range of lengths. For example, identity 265 corresponds to a length range of 11 or 12 bytes. By contrast, identity 284 corresponds to a length range of 227 bytes to 257 bytes. In order to specify a particular length from a Huffman code node identity that corresponds to a range of lengths, "extra bits" are added to the encoding of a Huffman code node identity. For example, one extra bit is added to the encoding for Huffman code node identity 265 so that two lengths (11 or 12 bytes) can be specified. By contrast, 5 extra bits are added to the Huffman code node identity 284 so that 31 different lengths (i.e., any one of lengths 227 through 257 inclusive) can be individually specified.

Notably, the encodings for any of Huffman node identities 0 through 285 are "non overlapping" which means their bit sequences are unique. For example, if one of the shortest encodings is 1010, no other encoding, shortest or otherwise, begins with the bit sequence 1010. As such, when the fully encoded bit stream is decoded, each individual encoded symbol is easy to recognize and can only correspond to one 8 bit pattern if a literal or length. As discussed above, some encoded lengths have associated extra bits. As observed in stream 205, any extra bits are appended to the encoded length. Thus, for instance, if a specific bit sequence is recognized in stream 205 by a decoder as corresponding to node identity 265, it is then immediately recognized that the next bit after the specific bit sequence must be the extra bit for that node identity. As another example, if a specific bit sequence is recognized in stream 205 by a decoder as corresponding to node identity 284, it is then immediately recognized that the next five bits after the specific bit sequence must be the extra bits for that node identity.

Distances are encoded according to a similar technique as lengths but a different Huffman tree is utilized (Huffman tree of second type, not shown). The second type of Huffman tree used for distances has 30 nodes instead of 286 (as with literal/length encodings) and is used to encode any distance from 1 byte to 32,768 bytes. Again, more frequent distances correspond to a lower tree node identity and a fewer number of bits in the encoded symbol, whereas, less common distances correspond to a higher tree node identity, more bits in the encoded symbol and the use of extra bits. For example, the $30^{th}$ node in the second type of Huffman tree is used to specify any distance within a range of 16,385 bytes to 32,768 bytes, and, 13 extra bits are utilized in conjunction with the encoded bit pattern for the $30^{th}$ node to specify a particular one of the distances within this range.

A problem with the decoding of a DEFLATE encoded data-stream is the sheer complexity of the decoding process which consumes a large number of CPU instructions when executed in software with generic instructions.

BRIEF DESCRIPTION OF THE DRAWINGS

The present invention is illustrated by way of example and not limitation in the figures of the accompanying drawings, in which like references indicate similar elements and in which:

FIG. 3 illustrates a representation of a first type of Huffman encoding used for literals and lengths;

FIG. 5*a* illustrates a literal/length (LL) table;

FIG. 5*b* illustrates a distance (D) table;

DETAILED DESCRIPTION

Figure 1:
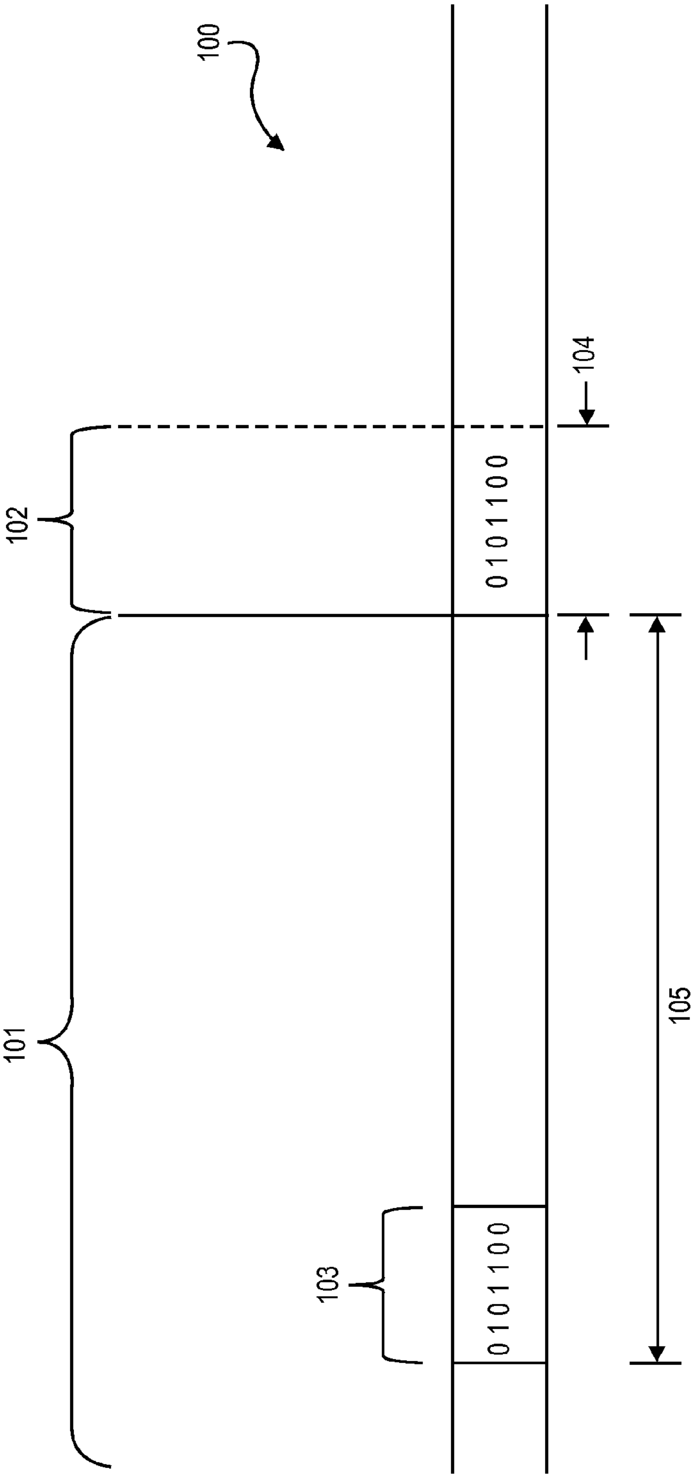
FIG. 1 illustrates shows an exemplary LZ77 encoding scheme.
Figure 2:
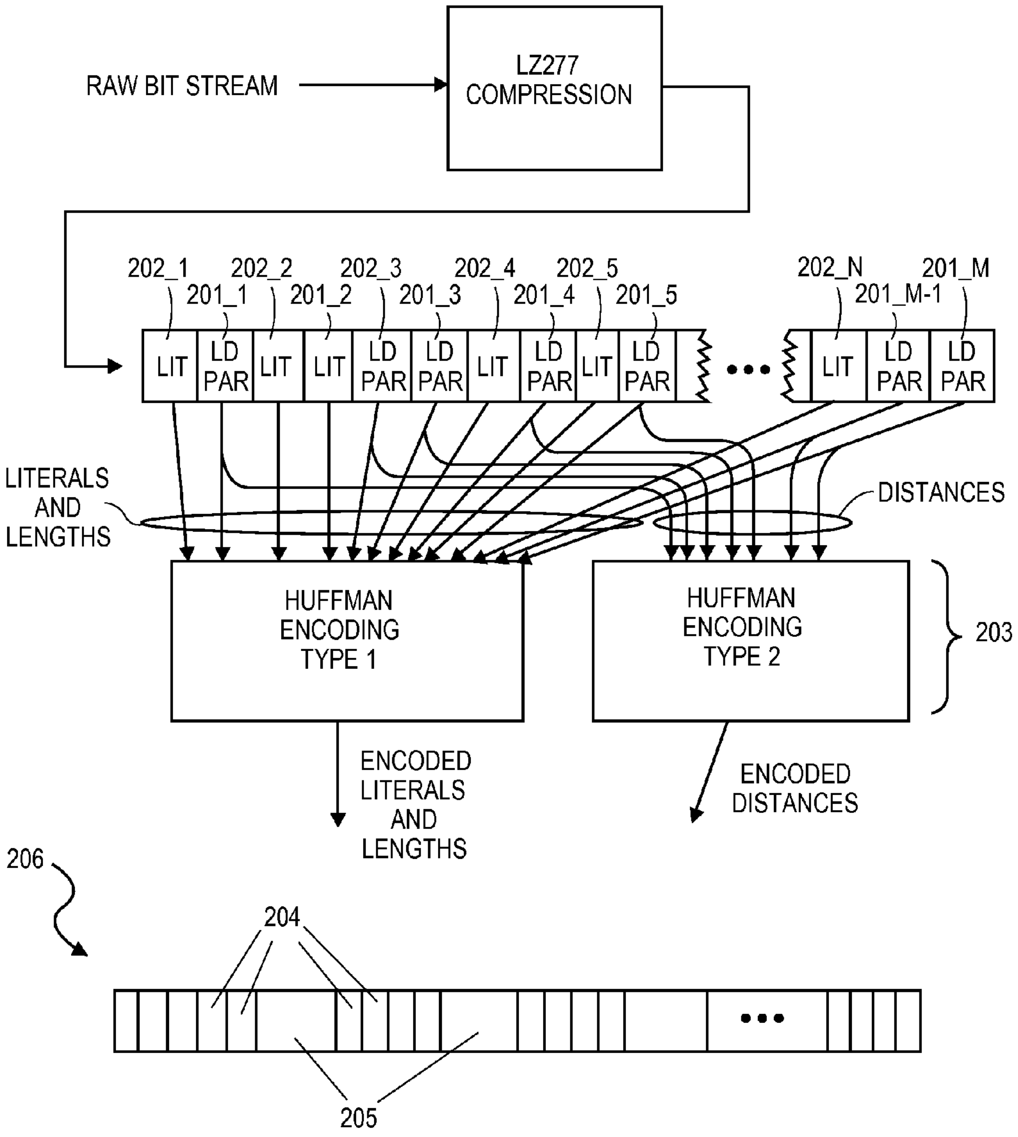
FIG. 2 illustrates one embodiment of a DEFLATE compression algorithm.
Figure 4:
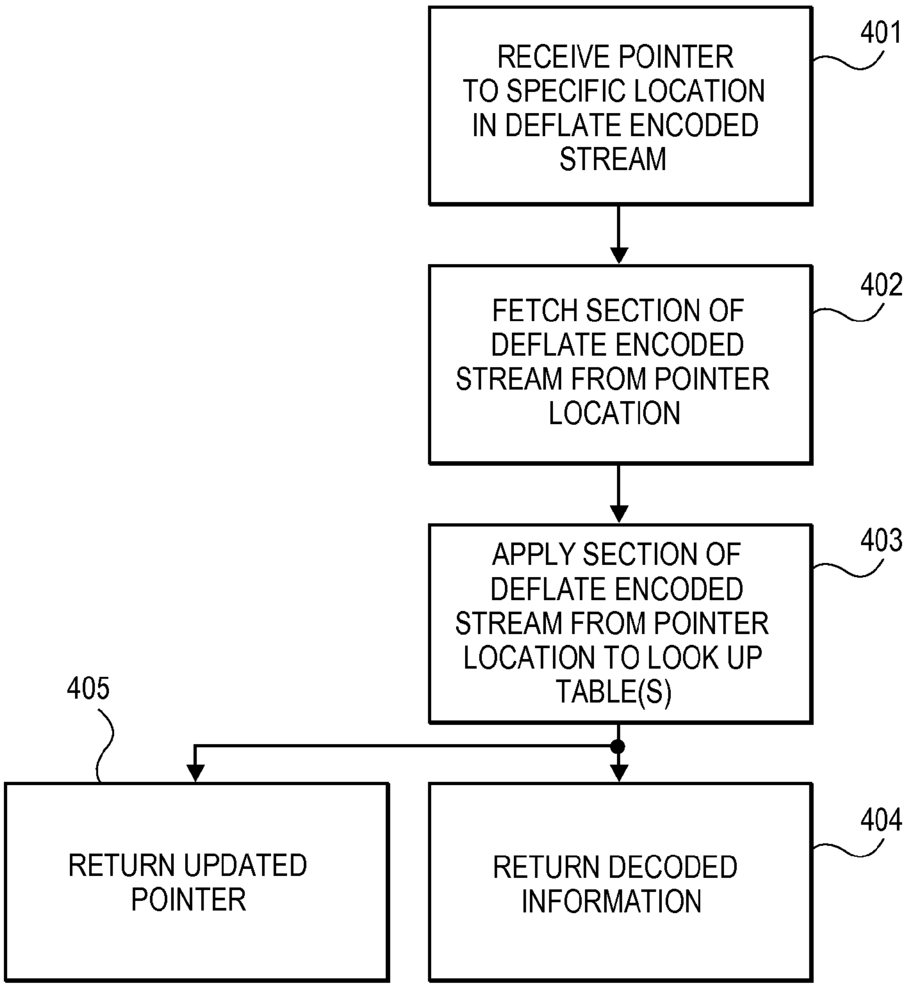
FIG. 4 illustrates a method in accordance with one embodiment of the invention.

In order to reduce the software footprint of a DEFLATE decoder, an instruction is proposed that can fully decode a DEFLATE encoded symbol in a single instruction. In order to implement this technique, the instruction is designed to refer to tabular information containing the translation/decoding for all DEFLATE encoded symbols. In an embodiment, referring to FIG. 4, the instruction: 1) receives 401 a pointer to specific location in a DEFLATE encoded bit stream; 2) fetches 402 a section (e.g., the next 16 bits) of the DEFLATE encoded bit stream from the pointed to location; and, 3) applies 403 the section of the DEFLATE encoded bit stream as an input parameter to the tabularized information.

The tabularized information returns a symbol of original information that was encoded within the received input section of encoded bit stream information, and, the instruction provides this original information as its resultant 404. In an embodiment, the instruction essentially provides as its resultant the information stream generated by the LZ77 compression stage (i.e., a stream of inter-mixed literals and length-distance pairs).

The instruction also increments the pointer to point to the new leading edge of un-decoded information within the encoded bit stream and returns the updated pointer as a resultant 405. The next instruction then accepts the new pointer value as an input operand to repeat the process so the next symbol of original information encoded within the stream can be returned. Eventually the entire encoded input stream will be decoded.

FIGS. 5*a* and 5*b* show embodiments of the tabular information. The tabular information includes both a literal/length (LL) table 501 as presented in FIG. 5*a* and a distance (D) table 502 as presented in FIG. 5*b*. In an embodiment both tables 501, 502 are kept in system memory. In another embodiment both tables 501, 502 are kept is special content addressable memory circuits that are, e.g., local and private to the instruction execution unit's logic circuitry, or, more globally available to other circuits in the processor. For convenience the remainder of this application will refer mainly to an embodiment where the CAM circuits are local and private to the instruction execution unit's logic circuitry.

The instruction execution unit is designed to issue a read request to the LL table 501 (and then the D table if the lookup into the LL table "hits" on a length) using the section of DEFLATE encoded input information as the look-up parameter. The LL table 501 provides decoded literal and length components of the encoded bit stream. The D table 502 provides decoded distance components of the encoded bit stream.

The LL table 501 not only provides decoded information but also an indication whether the decoded information corresponds to a literal or a length. If the decoded information is a length, the instruction automatically performs a look up into the D table 502 once the length and all its extra bits (if any) have been processed. Here, when decoding a DEFLATE compressed stream, a distance automatically follows a length. As such, the hardware knows as soon as a length's bits (including all of its extra bits if any) have been processed, distance bits must follow immediately thereafter. The D table returns the decoded distance value which the instruction will return as a second resultant along with the decoded length.

In an embodiment, each entry in either table 501, 502 corresponds to a specific tree node within the corresponding Huffman tree. Recalling that the literal and length (first type) Huffman tree contains 285 nodes, in an embodiment, the LL table 501 therefore contains 285 entries. Likewise, recalling that the distance Huffman tree contains 30 nodes, in an embodiment, the D table 502 contains 30 entries. The left hand side of each entry of both tables contain the encoded value for the corresponding Huffman tree node. The CAM circuitry attempts to match this information against the section of DEFLATE encoded input information being processed by the instruction and used as the look-up parameter into the CAM.

In an embodiment, smaller encoded values (which correspond to more frequent original data values) are listed higher up in the tables than larger encoded values (which correspond to less frequent original data values). When a segment of the encoded bit stream (which corresponds to the input data presented to the execution unit) is presented to a table, it is compared against the encoded values listed along the left hand side of the tables. A match on particular entry identifies what Huffman tree node the first encoded value within the segment corresponds to. The right hand side of the entry contains the original un-encoded data for the section of DEFLATE encoded input information and is provided as a resultant of the instruction.

The entry also includes additional information that the instruction hardware uses to understand whether literals, lengths or distances are being decoded as well as recognize where the boundary between decoded and yet-to-be decoded information resides in the encoded bit stream.

FIG. 5*a* shows an embodiment of an entry 520 in the LL table 501. As observed in FIG. 5, the entry 520 includes: 1) a first (left hand) field 511 that contains the encoded bit sequence of a particular section of encoded DEFLATE information (this is the matched-to information for the CAM entry); 2) a second (right hand) field 512 that contains the decoded (original) information of the encoded bit sequence for a literal (if the encoded input corresponds to a literal); 3) a third field 513 that specifies the size of the encoded bit sequence (i.e., how much of the section of DEFLATE encoded input information is being decoded by way of this entry); 4) a fourth field 514 that indicates whether the encoded bit sequence corresponds to an end of block symbol, a literal or a length and whether or not extra bits apply if the encoded input corresponds to a length; 5) a fifth field 515 that provides a decoded length (if the encoded input corresponds to a length); and, 6) a sixth field 516 that indicates the number of applicable extra bits (if the encoded input corresponds to a length).

According to one embodiment that uses the entry structure of FIG. 5, the LL table contains an entry only for lengths and literals. Because lengths always precede distances in a DEFLATE encoded stream, the instruction execution "knows" that if a match to length occurs in the LL table, the next set of information in the encoded stream must be a distance. As such, the instruction execution unit next jumps to the D table 502 in FIG. 5*b* to decode the distance information after receiving the entry for the length from table 501 of FIG. 5*a*.

In the embodiment, of FIG. 5, 4 bits are reserved for field 513 (so that decoded output sizes of up to 16 bits can be specified, note that the value of field 513 for entry 520 provides a value of eight to indicate the encoded input 511 of entry 520 is eight bits in size) and 2 bits are reserved for field 514 (00=EOB; 01=literal; 10=length and extra bits do not apply; 11=length and extra bits apply); 6 bits are reserved for field 515 which contains the "base" decoding for a length (i.e., the decoding of a length without extra bits); and, 4 bits are reserved for field 516 which specifies how many extra bits apply (if field 514=11). In an embodiment, the actual entries are constructed such that the content of field 512 physically overlaps the content of fields 515 and 516 (e.g., the same 10 bits in the entry provide the decoded literal in the case of a literal, or, the 6 bit base and 4 bit extra bit information in the case of a length).

Thus, in the case where the decoded symbol corresponds to a length, the instruction hardware is told whether or not extra bits are following the length base and if so how many. In response, if there are no extra bits, the base length value held in field 515 corresponds to the decoded length value that is returned as the resultant. If there are extra bits, the hardware will additionally fetch the correct number of extra bits from the data stream (as they immediately follow the base length in the encoded data stream) and use the extra bits in combination with the base length returned from the LL table to determine a final, complete length that is returned in the resultant. As alluded to above, a following operation to be performed by the hardware once a specific length is determined is to perform a second lookup into the D table 502. Here, as a distance follows a length in DEFLATE compression, the instruction logic will fetch a next segment of the bit stream in the section of DEFLATE encoded information originally presented to the instruction execution unit as an input operand. The instruction execution hardware applies the next segment of input DEFLATE encoded information to the D table 502.

In an embodiment, as seen in FIG. 5*b*, entries in the D table 502 are formatted the same as/similar to the length entries in the LL table 501. In particular, since distances have base values and can also have extra bits, the entries in the D table 502 resemble those of entries 257 through 284 of FIG. 5*a*. A type value 530 indicates whether or not extra bits apply (0=no extra bits; 1=extra bits). If no extra bits apply base decoded distance field 531 provides the decoded distance as the resultant. If extra bits apply, field 533 informs the hardware of the number of applicable extra bits. The instruction hardware then fetches the extra bits from the encoded data stream and in combination with the base value provides the same as the decoded resultant distance.

Figure 6:
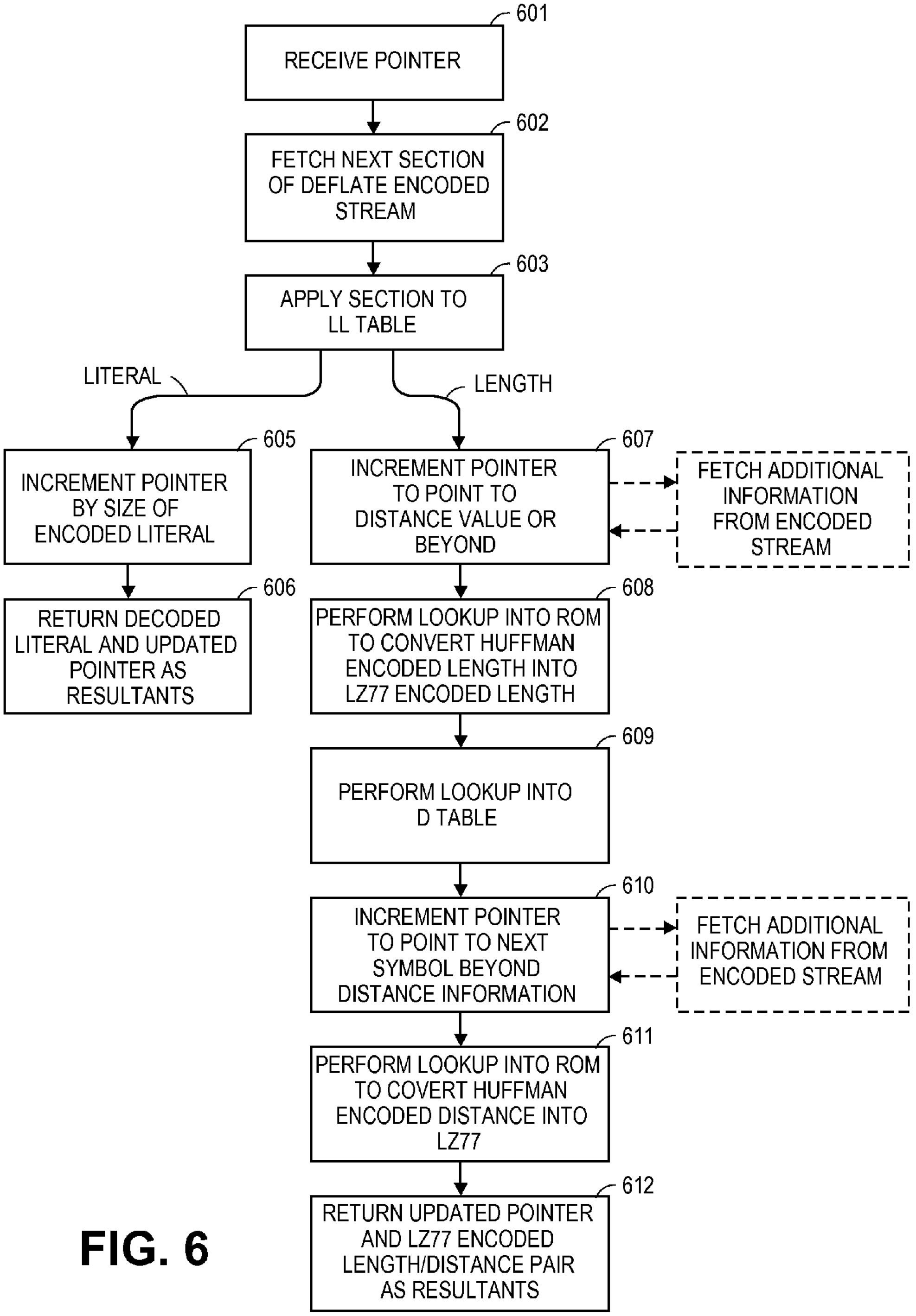
FIG. 6 illustrates a method in accordance with one embodiment of the invention.

FIG. 6 shows a first process described above performed by the instruction execution unit hardware. As observed in FIG. 6, after receiving a pointer 601 to the starting section of a DEFLATE encoded stream as an input operand (and, e.g., an address where the encoded stream can be found in system memory), the instruction execution unit fetches the section of the DEFLATE encoded stream 602 and presents it as an input parameter to a first CAM circuit having an LL table 603. The LL table returns an entry that indicates whether the leading edge of the section contains a literal or a length 604.

If the leading edge contains a literal the LL table also returns the decoded value for the literal and the number of bits consumed by the encoded literal. The pointer is incremented by the number of bits so as to effectively point to the new leading edge of yet-to-be decoded information in the stream 605. The decoded literal and the new pointer are then returned as resultants 606.

If the leading edge contains a length, the LL table returns the base decoded length and how many extra bits apply if any. The execution unit increments the pointer 607 to account for both the decoded length base (6 bits) and the extra bits (if any) so the new pointer value points to the leading edge of un-encoded information, which, as discussed above, points to a distance value. Note that the presence of extra bits, not only in the just decoded length but also potentially in the yet-to-be decoded distance, the amount of encoded DEFLATE information may exceed the section of DEFLATE information originally fetched by the instruction execution unit. Essentially, if the new pointer points to information that needs to be fetched, the instruction execution unit will issue a read request to system memory for the additional information. In an embodiment, because, a distance value is known to follow a length value, the execution unit will fetch information beyond the extra bits of the length into at least the base value of the subsequent distance and adjust the pointer accordingly.

Whether additional DEFLATE encoded information is fetched or not, after all of the information for an encoded length has been fetched from the encoded DEFLATE stream, a lookup is performed in a first ROM to convert the base length and extra bits (if any) introduced by the Huffman encoding back into an LZ77 encoded length 608.

A lookup into the D table 609 is also automatically performed (recall that as part of the process of decoding of the length, the pointer increments to the beginning of the distance value 607 and may even fetch encoded DEFLATE information beyond the length and its extra bits (if any) to capture at least the base component of the following encoded distance value and update the pointer accordingly). The section of DEFLATE encoded distance information is then presented to the D table which returns the decoded distance base and the number of extra bits (if any) 609. The instruction execution unit then fetches additional DEFLATE encoded information to at least encompass the extra bits (if any) and update the pointer accordingly. When the encoded base and extra bits are obtained and the pointer has been updated to point to the beginning of the next encoded symbol in the DEFLATE stream after the distance encoded information 610, the execution unit performs a look-up into an on-board ROM to decode the Huffman distance into an LZ77 distance 611.

Once the LZ77 length and distance has been obtained, the execution unit can return these values as resultants along with an updated pointer value that points to the beginning of the next symbol following the distance information 612.

In an embodiment, the instruction is intended to be incorporated into software that "loops" through multiple iterations of the instruction where the instruction operates on the pointer value produced as the resultant by the immediately preceding instruction. In a further embodiment, each iteration of the loop contains one execution of the instruction described herein followed by a memory write instruction to write the decoded resultants (the LZ77 information) into system memory. The next loop repeats using as its input operand the pointer produced by the previous loop. A compiler can construct code by introducing instructions to the code under construction consistent with this approach.

In a further embodiment the execution unit is designed to write flags into control register space to indicate: 1) a length/distance pair has been returned as the resultant; 2) an EOB has been encountered; 3) does any part of the instruction need to be replayed. The later flag corresponds to a "partial progress" capability of the instruction execution unit. Specifically, it is possible that the memory accesses performed by the instruction execution unit may result in some kind of error. In this case, the instruction execution unit will return as its resultant the pointer value at which point the decoding process should restart. In an embodiment, this pointer value may be the start of the distance value when the instruction was able to successfully decode the length.

Figure 7:
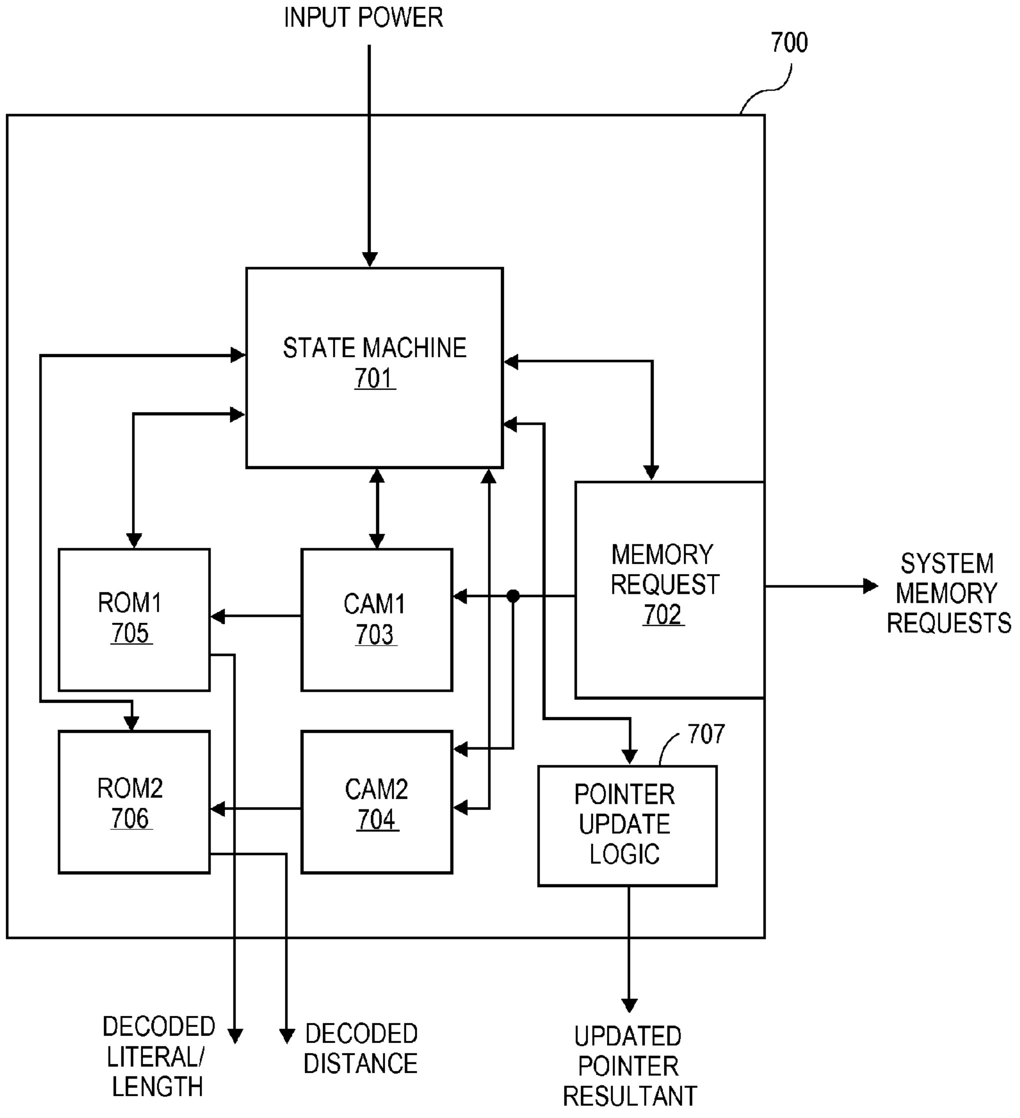
FIG. 7 illustrates one embodiment of an architecture of an execution unit.

FIG. 7 shows an embodiment of the logic design for the execution unit 700. As observed in FIG. 7, the logic includes state machine logic circuitry 701 that oversees/causes the performance of the various methodologies described above. The state machine 701 receives the input pointer as an input operand from register space. The instruction execution unit includes memory request logic 702 to issue memory read requests for next sections of encoded DEFLATE information in system memory. The instruction execution unit also includes first and second CAM circuits 703, 704 to implement the aforementioned LL and D tables. The instruction execution unit also includes first and second ROM circuits 705, 706 to implement the Huffman to LZ77 conversions described above. The execution unit also includes pointer update logic circuitry 707 to update pointer values consistent with the discussion above. The resultants of the execution unit are written back to register space. The state machine can be implanted as dedicated logic circuitry, micro-code or some combination thereof.

Figure 8:
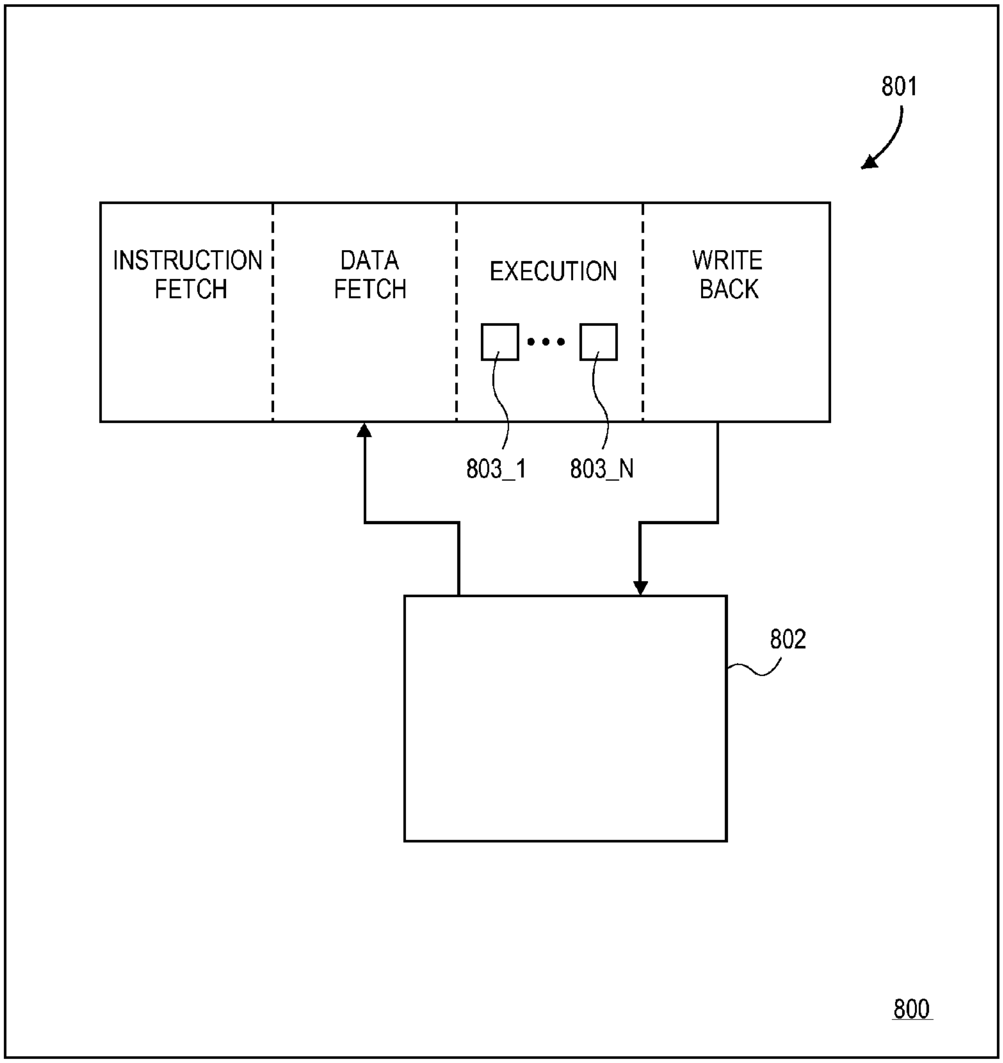
FIG. 8 illustrates a processing core implemented with logic circuitry on a semiconductor chip.

FIG. 8 shows a high level diagram of a processing core 800 implemented with logic circuitry on a semiconductor chip. The processing core includes a pipeline 801. The pipeline consists of multiple stages each designed to perform a specific step in the multi-step process needed to fully execute a program code instruction. These typically include at least: 1) instruction fetch and decode; 2) data fetch; 3) execution; 4) write-back. The execution stage performs a specific operation identified by an instruction that was fetched and decoded in prior stage(s) (e.g., in step 1) above) upon data identified by the same instruction and fetched in another prior stage (e.g., step 2) above). The data that is operated upon is typically fetched from (general purpose) register storage space 802.

New data that is created at the completion of the operation is also typically "written back" to register storage space (e.g., at stage 4) above).

The logic circuitry associated with the execution stage is typically composed of multiple "execution units" or "functional units" 803_1 to 803_N that are each designed to perform its own unique subset of operations (e.g., a first functional unit performs integer math operations, a second functional unit performs floating point instructions, a third functional unit performs load/store operations from/to cache/memory, etc.). The collection of all operations performed by all the functional units corresponds to the "instruction set" supported by the processing core 800. The logic design 700 of FIG. 7 may be incorporated into one of the functional units of the execution stage in order to realize a core having the aforementioned instruction execution capability.

Figure 9:
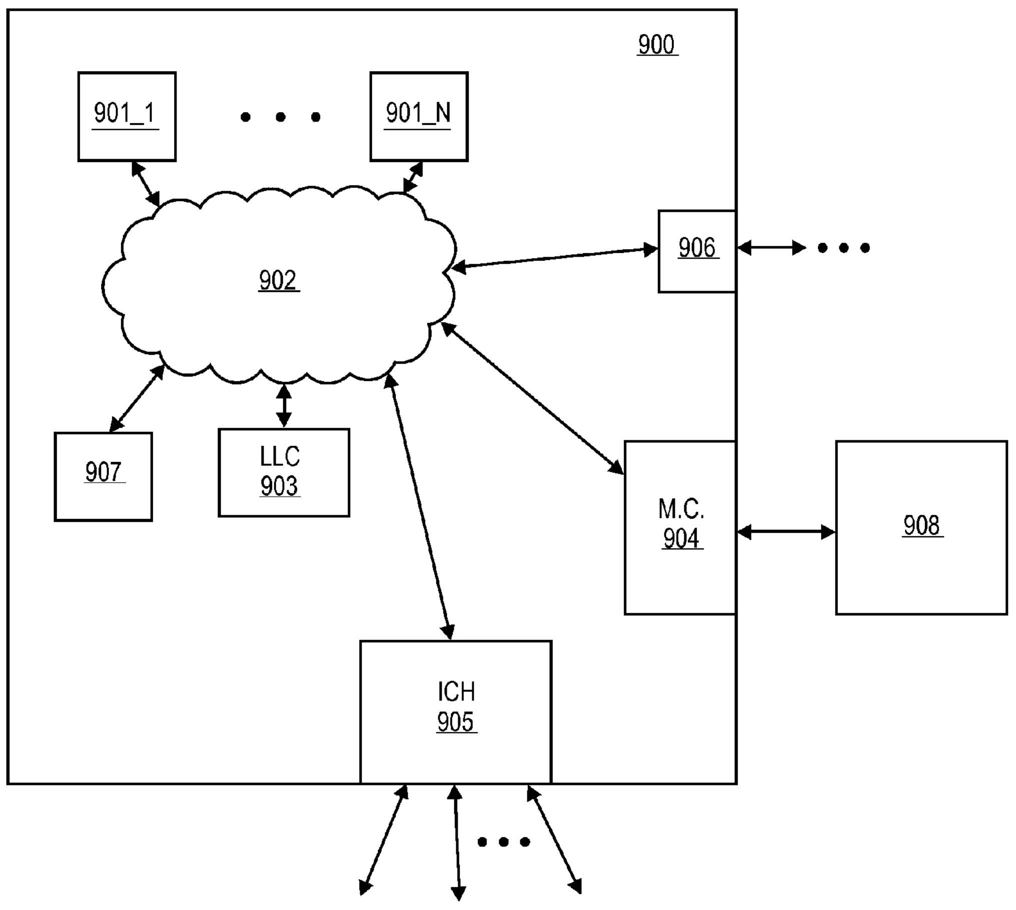
FIG. 9 illustrates the architecture of an exemplary multi-core processor.
Figure 10:
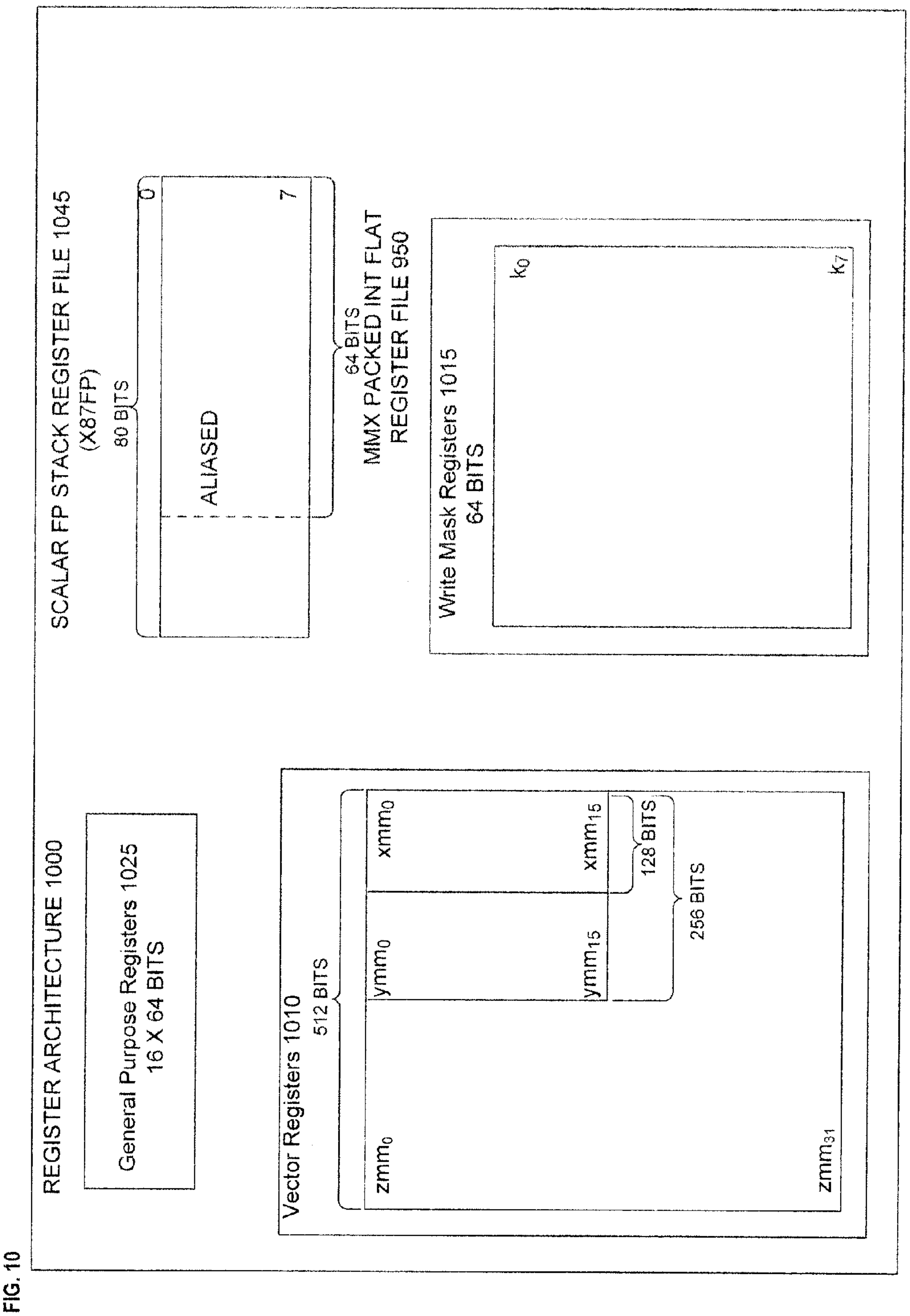
FIG. 10 is a block diagram of a register architecture according to one embodiment of the invention.
Figure 11A:
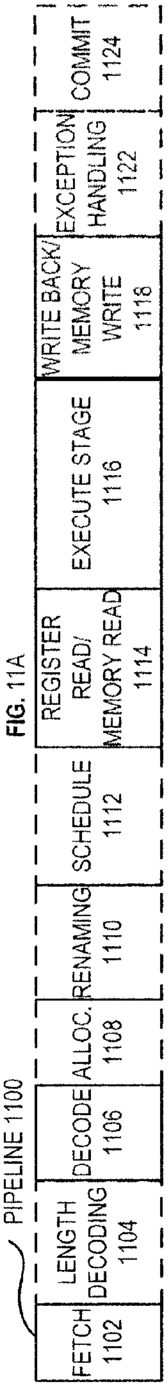
FIG. 11A is a block diagram illustrating both an exemplary in-order pipeline and an exemplary register renaming, out-of-order issue/execution pipeline according to embodiments of the invention.
Figure 11B:
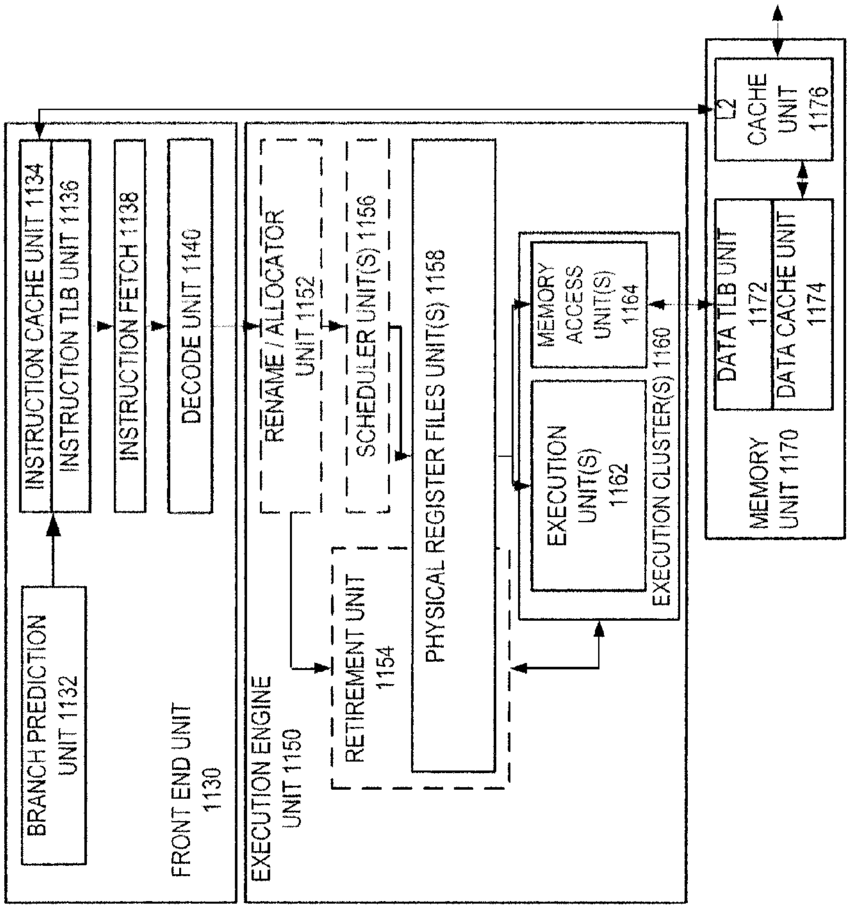
FIG. 11B is a block diagram illustrating both an exemplary embodiment of an in-order architecture core and an exemplary register renaming, out-of-order issue/execution architecture core to be included in a processor according to embodiments of the invention.
Figure 12B:
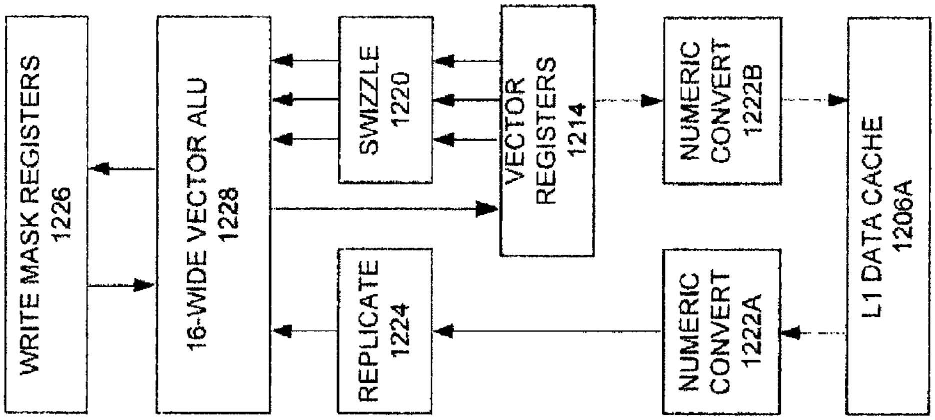
FIGS. 12 A-B illustrate a block diagram of a more specific exemplary in-order core architecture, which core would be one of several logic blocks (including other cores of the same type and/or different types) in a chip.
Figure 12A:
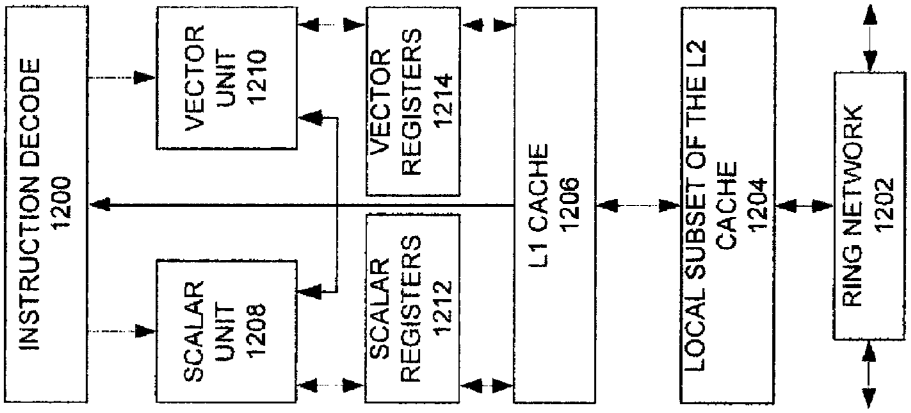
Figure 13:
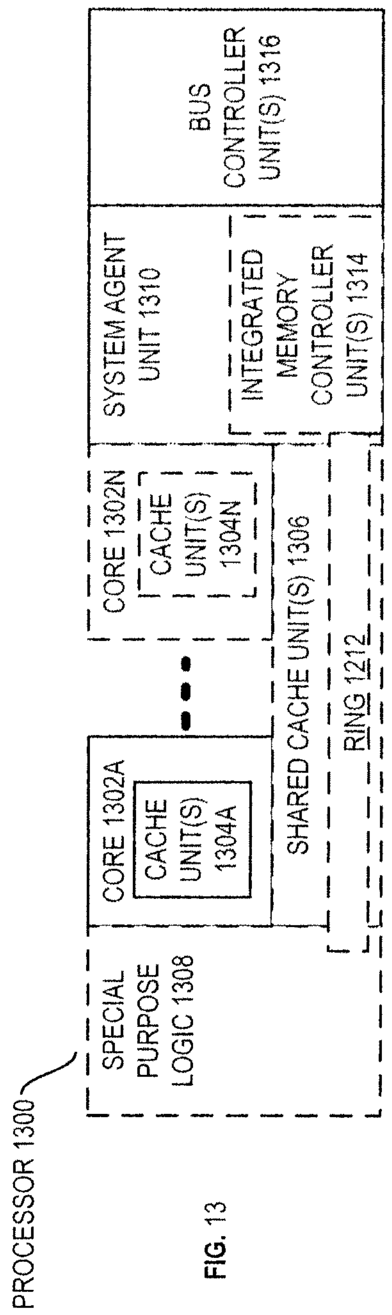
FIG. 13 is a block diagram of a processor that may have more than one core, may have an integrated memory controller, and may have integrated graphics according to embodiments of the invention.
Figure 14:
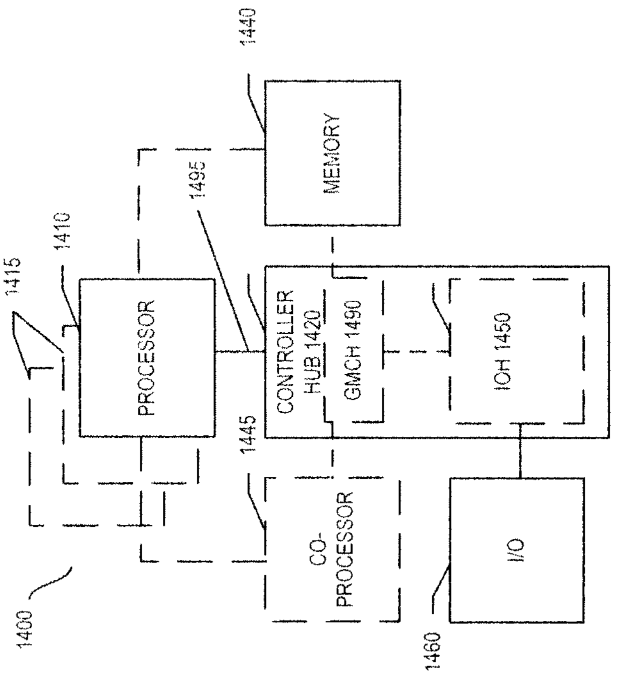
FIG. 14 is a block diagram of a exemplary system in accordance with an embodiment of the present invention.
Figure 15:
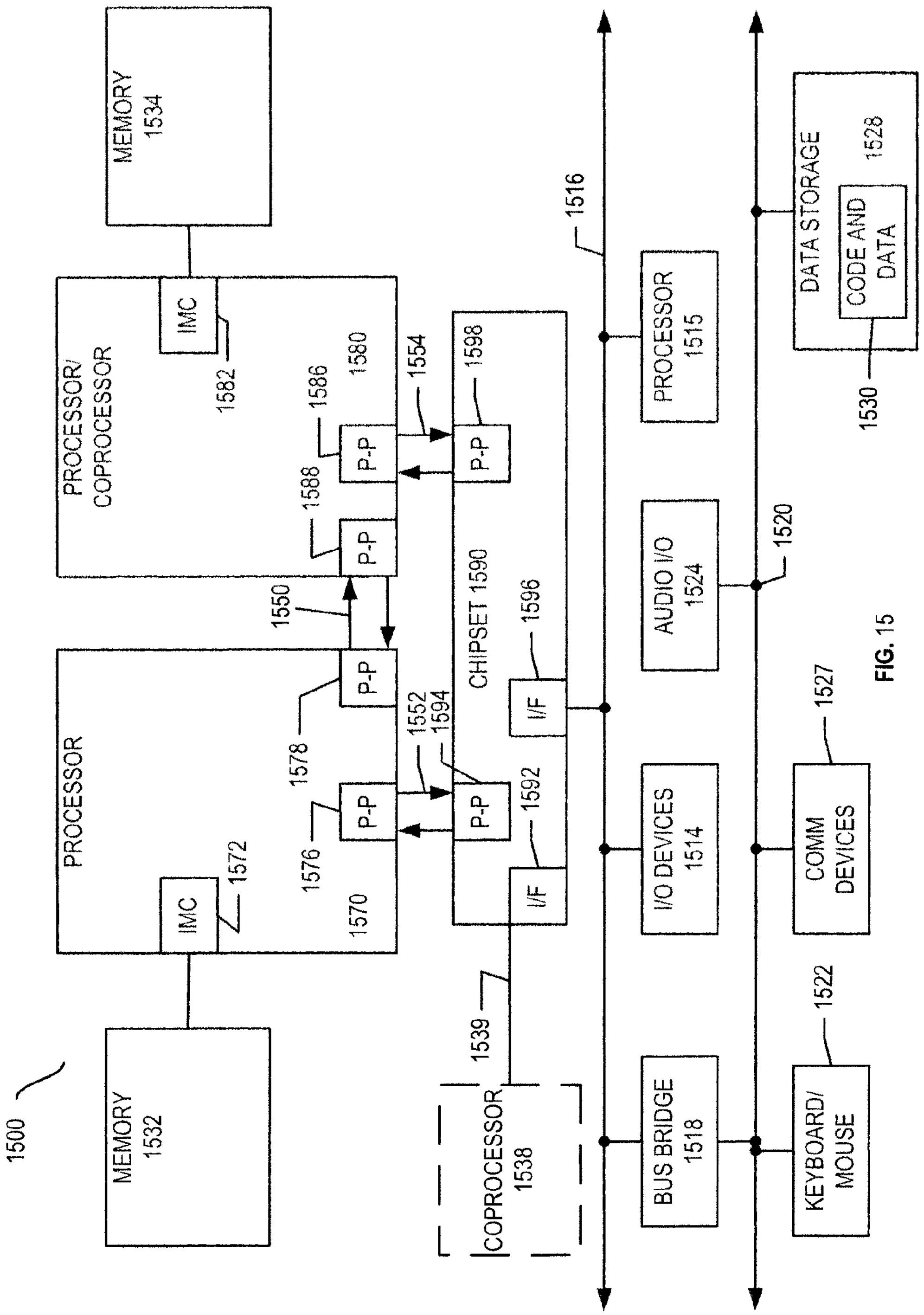
FIG. 15 is a block diagram of a first more specific exemplary system in accordance with an embodiment of the present invention.
Figure 16:
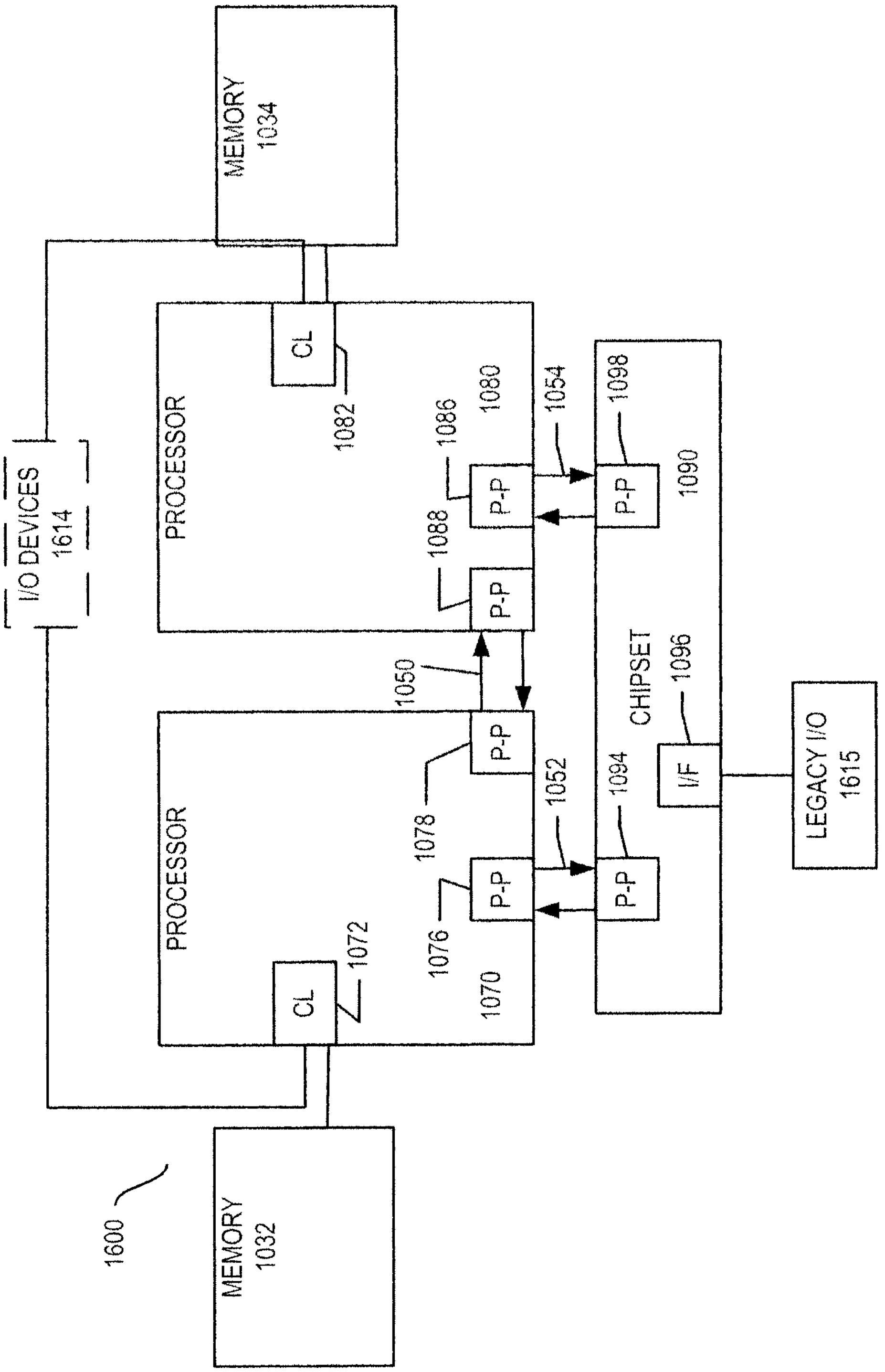
FIG. 16 is a block diagram of a second more specific exemplary system in accordance with an embodiment of the present invention.
Figure 17:
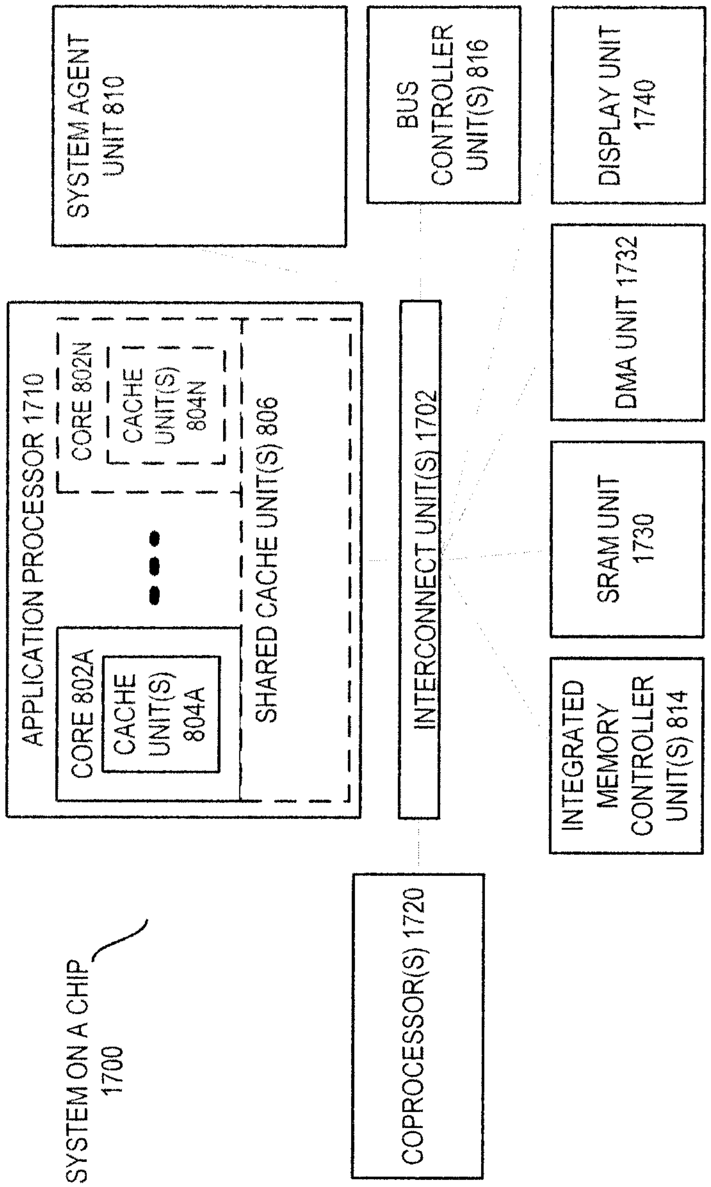
FIG. 17 is a block diagram of a SoC in accordance with an embodiment of the present invention.
Figure 18:
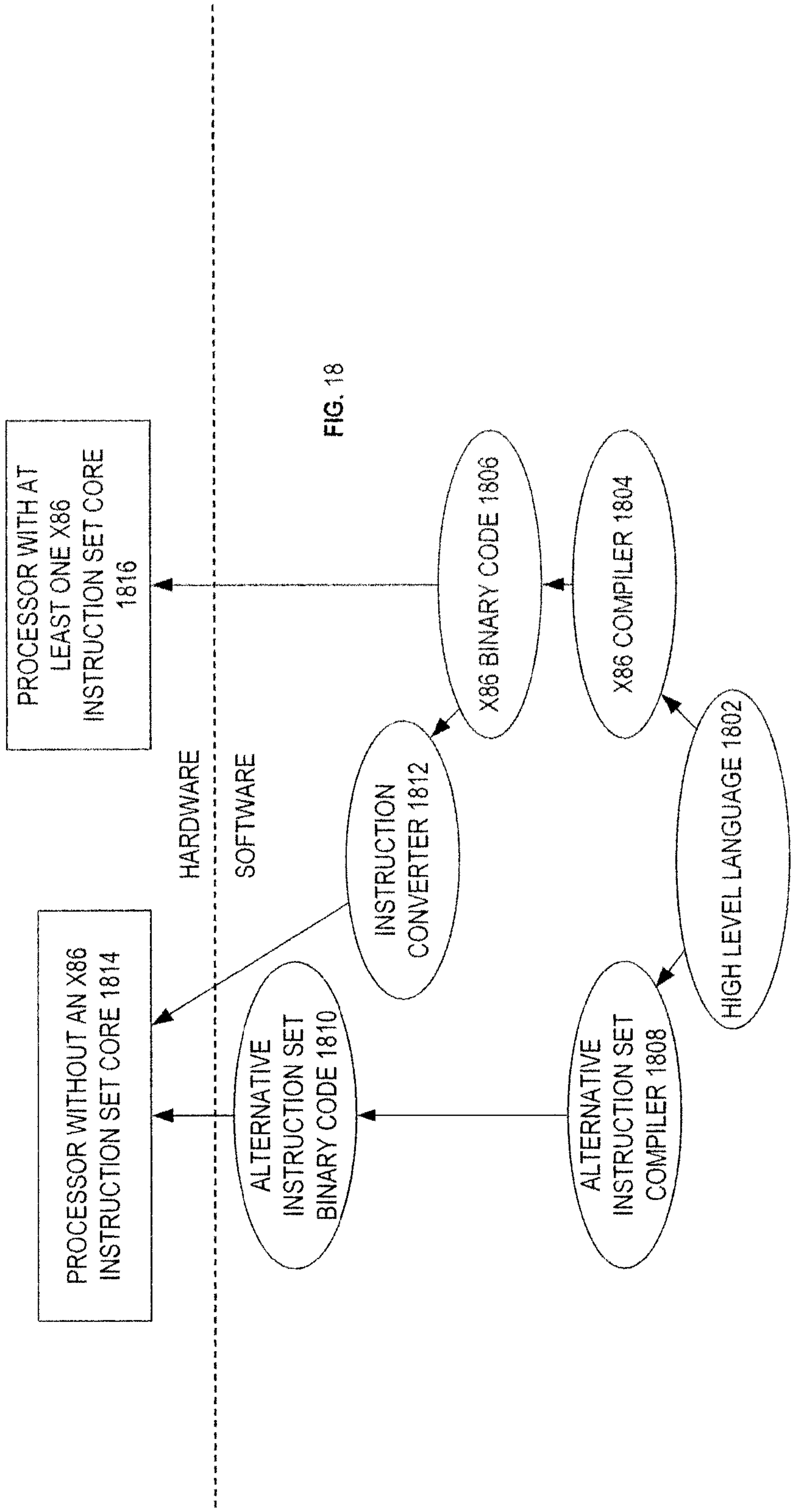
FIG. 18 is a block diagram contrasting the use of a software instruction converter to convert binary instructions in a source instruction set to binary instructions in a target instruction set according to embodiments of the invention.

FIG. 9 shows the architecture of an exemplary multi-core processor 900. As observed in FIG. 9, the processor includes: 1) multiple processing cores 901_1 to 901_N; 2) an interconnection network 902; 3) a last level caching system 903; 4) a memory controller 904 and an I/O hub 905. Each of the processing cores contain one or more instruction execution pipelines for executing program code instructions. Any or all of such instruction execution pipelines may include an execution unit for performing DEFLATE decoding as discussed above. The interconnect network 902 serves to interconnect each of the cores 901_1 to 901_N to each other as well as the other components 903, 904, 905. The last level caching system 903 serves as a last layer of cache in the processor before instructions and/or data are evicted to system memory 908.

The memory controller 904 reads/writes data and instructions from/to system memory 908. The I/O hub 905 manages communication between the processor and "I/O" devices (e.g., non volatile storage devices and/or network interfaces). Port 906 stems from the interconnection network 902 to link multiple processors so that systems having more than N cores can be realized. Graphics processor 907 performs graphics computations. Power management circuitry (not shown) manages the performance and power states of the processor as a whole ("package level") as well as aspects of the performance and power states of the individual units within the processor such as the individual cores 901_1 to 901_N, graphics processor 907, etc. Other functional blocks of significance (e.g., phase locked loop (PLL) circuitry) are not depicted in FIG. 9 for convenience.

Processes taught by the discussion above may be performed with program code such as machine-executable instructions which cause a machine (such as a "virtual machine", a general-purpose CPU processor disposed on a semiconductor chip or special-purpose processor disposed on a semiconductor chip) to perform certain functions. Alternatively, these functions may be performed by specific hardware components that contain hardwired logic for performing the functions, or by any combination of programmed computer components and custom hardware components.

A storage medium may be used to store program code. A storage medium that stores program code may be embodied as, but is not limited to, one or more memories (e.g., one or more flash memories, random access memories (static, dynamic or other)), optical disks, CD-ROMs, DVD ROMs, EPROMs, EEPROMs, magnetic or optical cards or other type of machine-readable media suitable for storing electronic instructions. Program code may also be downloaded from a remote computer (e.g., a server) to a requesting computer (e.g., a client) by way of data signals embodied in a propagation medium (e.g., via a communication link (e.g., a network connection)).

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A processor, comprising:

an instruction execution pipeline having:

an instruction fetch unit to fetch and decode an instruction; and an execution unit to execute the instruction, the execution unit comprising a state machine and content addressable memory (CAM) circuitry, the state machine to receive a pointer to a stream of DEFLATE encoded information, fetch a section of the DEFLATE encoded information, and apply the section of the DEFLATE encoded information to the CAM to obtain decoded DEFLATE information.

2. The processor of claim 1 wherein the CAM contains information to decode literals and lengths.

3. The processor of claim 2 wherein the information indicates how many extra bits apply for a particular DEFLATE encoded length.

4. The processor of claim 2 wherein entries in the CAM indicate whether they contain information for a literal.

5. The processor of claim 2 wherein entries in the CAM indicate whether they contain information for a length.

6. The processor of claim 1 wherein the execution unit contains a second CAM that contains information to decode a distance.

7. The processor of claim 6 wherein entries of the second CAM indicate whether extra bits apply.

8. The processor of claim 1 wherein the execution unit returns an updated pointer value.

9. The processor of claim 1 wherein the execution unit is to write to control register space to indicate partial completion if the instruction only partially completes execution of the instruction.

10. The processor of claim 9 wherein the execution unit is to return an updated pointer even if the execution only partially completes execution of the instruction.

11. A method, comprising:

fetching an instruction;

decoding the instruction;

executing the instruction on a processor, where the executing of the instruction includes:

receiving a pointer to a stream of DEFLATE encoded information;

fetching a section of the DEFLATE encoded information; and applying the section of the DEFLATE encoded information to a content addressable memory (CAM) to obtain a decoded DEFLATE information.

12. The method of claim 11 wherein the CAM contains information to decode literals and lengths.

13. The method of claim 12 wherein the information indicates how many extra bits apply for a particular DEFLATE encoded length.

14. The method of claim 12 wherein entries in the CAM indicate whether they contain information for a literal.

15. The method of claim 12 wherein entries in the CAM indicate whether they contain information for a length.

16. The method of claim 11 wherein the processor contains a second CAM that contains information to decode a distance.

17. A non-transitory machine readable storage medium having instructions that when processed by a computing system cause a method to be performed, said method comprising:

constructing software code by:

introducing a first instruction that accepts a pointer to DEFLATE encoded information and decodes a section of said DEFLATE encoded information to produce a decoded section of DEFLATE information and an updated pointer that accounts for said decoded section's size; and introducing a loop operation to re-execute said instruction using said updated pointer as an input operand.

18. The non-transitory machine readable storage medium of claim 17 wherein said constructing further comprises introducing a memory write instruction between said instruction and said loop operation to write said decoded section to a system memory.

19. The non-transitory machine readable storage medium of claim 17 wherein said constructing further comprises introducing code to handle a partial completion of said instruction.

20. A non-transitory machine readable storage medium having instructions that when processed by a computing system cause a method to be performed, said method comprising:

executing a first instruction that accepts a pointer to DEFLATE encoded information and decodes a section of said DEFLATE encoded information to produce a decoded section of DEFLATE information and an updated pointer that accounts for said decoded section's size; and executing a loop operation to re-execute a second instruction of same type as said instruction that uses as an input operand a respective updated pointer from a previous instruction of said same type.

21. The non-transitory machine readable storage medium of claim 20 further comprising executing a memory write instruction after said executing of said first instruction to write said decoded section of DEFLATE information to a system memory.

* * * * *